United States Patent
Gao et al.

(10) Patent No.: US 9,362,876 B2
(45) Date of Patent: Jun. 7, 2016

(54) LOOK-UP TABLE DIGITAL PREDISTORTION TECHNIQUE FOR HIGH-VOLTAGE POWER AMPLIFIERS IN ULTRASONIC APPLICATIONS

(71) Applicant: Southern Methodist University, Dallas, TX (US)

(72) Inventors: Zheng Gao, Dallas, TX (US); Ping Gui, Dallas, TX (US)

(73) Assignee: Southern Methodist University, Dallas, TX (US)

( * ) Notice: Subject to any disclaimer, the term of this patent is extended or adjusted under 35 U.S.C. 154(b) by 0 days.

(21) Appl. No.: 13/724,615

(22) Filed: Dec. 21, 2012

(65) Prior Publication Data

US 2013/0162349 A1    Jun. 27, 2013

Related U.S. Application Data

(60) Provisional application No. 61/579,213, filed on Dec. 22, 2011.

(51) Int. Cl.
    *H03F 1/26* (2006.01)
    *H03G 1/00* (2006.01)
    *H03F 1/32* (2006.01)

(52) U.S. Cl.
    CPC ........... *H03G 1/0005* (2013.01); *H03F 1/3241* (2013.01)

(58) Field of Classification Search
    USPC .................. 330/149; 375/296–297; 455/114.3
    See application file for complete search history.

(56) References Cited

U.S. PATENT DOCUMENTS

| 7,847,631 B2 | 12/2010 | Jiang et al. |
| 8,064,850 B2 | 11/2011 | Yang |
| 8,064,851 B2 | 11/2011 | McCallister |
| 2009/0256630 A1* | 10/2009 | Brobston ............ 330/2 |

OTHER PUBLICATIONS

Avasarala, M., et al, "High Efficiency Small Size 6W Class AB X-Band Power Amplifier Module Using a Novel MBE GaAs FET," IEEE MTT-S Digest, DD-4, 1988, pp. 843-846.
Cavers, James K., "Amplifier Linearization Using a Digital Predistorter with Fast Adaptation and Low Memory Requirements," IEEE Transactions on Vehicular Technology, vol. 39, No. 4, Nov. 1990, pp. 374-382.

(Continued)

*Primary Examiner* — Khanh V Nguyen
*Assistant Examiner* — Khiem Nguyen
(74) *Attorney, Agent, or Firm* — Daniel J. Chalker; Chalker Flores, LLP

(57) ABSTRACT

The present invention includes a digital controller for use with an ultrasound power amplifier circuit to increase linearity and efficiency of the ultrasound power amplifier circuit. The digital controller includes a digital signal generator and a memory unit that is coupled to the digital signal generator. The memory unit includes a processor that obtains an output signal from the ultrasound power amplifier circuit, calculates error by obtaining a difference between an ideal output signal and the output signal that is obtained from the ultrasound power amplifier circuit, and equalizes an input signal from the digital signal generator to reduce nonlinearity in the output signal of the ultrasound power amplifier circuit. The memory unit includes a look-up-table for storing values of error.

32 Claims, 5 Drawing Sheets

(56) References Cited

OTHER PUBLICATIONS

Haider, Bruno, "Power Drive Circuits for Diagnostic Medical Ultrasound," Proceedings of the 18th International Symposium on Power Semiconductor Devices & IC's, 2006.

Kwon, Dae Hyun, et al, "Digitally Equalized CMOS Transmitter Front-End With Integrated Power Amplifier," IEEE Journal of Solid-State Circuits, vol. 45, No. 8, 2010, pp. 1602-1614.

Nagata, Yoshinori, "Linear Amplification Technique for Digital Mobile Communications," IEEE, 1989.

Brunner, E., "How Ultrasound System Considerations Influence Front-end Component Choice," Analog Dialogue, Analog Devices, 2002.

Cerasani, U., et al, "A Practical FPGA-Based LUT-Predistortion Technology for Switch-Mode Power Amplifier Linerarization," NORCHIP, 2009, pp. 1-5.

Chung, S., et al, "Open-Loop Digital Predistortion Using Cartesian Feedback for Adaptive RF Power Amplifier Linearization," IEEE/MTT-S International Microwave Symposium, 2007, pp. 1449-1452.

Harrer, J.U., et al, "Second harmonic imaging: a new ultrasound technique to access human brain tumour perfusion," J. Neurol Neurosurg psychiatry, 2003, 74:333-338.

Hitachi High-Voltage Linear Amplifier Brochure, Hitachi Micro Device Division, Tokyo, Japan, 2011.

Huang, S., et al, "Arbitrary Waveform Coded excitation Using Bipolar Square Wave Pulsers in Medical Ultrasound," IEEE Trans. Ultrasonics, Ferroelectrics and Frequency Control, vol. 53, pp. 106-116, Jan. 2006.

Wang, C., et al, "A Nonlinear Capacitance Cancellation Technique and its application to a CMOS Class AB Power Amplifier," IEEE Radio Frequency Integrated Circuit Symposium, 2001, pp. 29-42.

Woo, Y.Y., et al, "Adaptive Digital Feedback Pre-distortion Technique for Linearizing Power Amplifiers," IEEE Trans. on Microwave Theory and Techniques, vol. 55, pp. 932-940, May 2007.

\* cited by examiner

US 9,362,876 B2

LOOK-UP TABLE DIGITAL PREDISTORTION TECHNIQUE FOR HIGH-VOLTAGE POWER AMPLIFIERS IN ULTRASONIC APPLICATIONS

CROSS-REFERENCE TO RELATED APPLICATIONS

This application claims priority to U.S. Provisional Application Ser. No. 61/579,213, filed Dec. 22, 2011, the entire contents of each of which is incorporated herein by reference.

TECHNICAL FIELD OF THE INVENTION

The present invention relates in general to the field of power amplifiers, and more specifically to using look-up-table digital predistortion techniques for high-voltage power amplifiers in ultrasonic applications.

STATEMENT OF FEDERALLY FUNDED RESEARCH

None.

INCORPORATION-BY-REFERENCE OF MATERIALS FILED ON COMPACT DISC

None.

BACKGROUND OF THE INVENTION

A power amplifier (PA) is one of the necessary devices in many systems and the distortion of the signals caused by nonlinear characteristics of power amplifier is one of the main reasons for the reduction of power amplifier power efficiency. Therefore, it is of importance to take linearization techniques to improve the power efficiency of PA. Among the numerous linearization techniques, digital pre-distortion techniques are widely used and fall into two main technical categories: look-up table (LUT) based and polynomial based technique. However, LUT based pre-distortion techniques require large random access memory storage and has a slow convergence speed. Without limiting the scope of the invention, its background is described in connection with systems, apparatus and methods for correcting the nonlinearity of a power amplifier of the type that may be used in ultrasonic applications.

For example, U.S. Pat. No. 8,064,851, entitled, "RF Transmitter with Bias-Signal-Induced Distortion Compensation and Method Therefore" discloses an RF transmitter generates non-DC bias signals configured to improved power-added efficiency (PAE) in the operation of an RF amplifier. The RF amplifier generates an amplified RF signal which, due to the addition of the bias signals, includes bias-signal-induced RF distortion. The bias signals drive a bias-induced distortion cancellation circuit that adjusts the bias signals to compensate for the influence of impedances experienced by the bias signals before being applied to the RF amplifier. After mixing with a baseband communication signal, adjusted bias signals are combined into a composite baseband signal, upconverted to RF in an upconversion section 84, and applied to the RF amplifier where they cancel at least a portion of the bias-signal-induced RF distortion.

Another example includes, U.S. Pat. No. 8,064,850, entitled, "High Efficiency Linearization Power Amplifier for Wireless Communication" discloses an embodiment of the invention uses a predistortion correction signal to combination the modulated RF signal by an analog multiplier for linearization of power amplifiers having nonlinear characteristics such as those used in wireless RF transmitters. A predistortion controller comprises a plurality of down converters for retrieving both the ideal non-distorted information and the feedback distorted information, together with pre-stored digitally-indexed predistortion information stored, for example, in a look-up table. The digitally-indexed information models nonlinear characteristics of the high power amplifier, and is stored prior to processing of pre-compensation in the power amplifier. When the predistortion information is combined with the modulated RF signal in the analog multiplier, the result is a substantially linear information transmission from the power amplifier. In an embodiment of the system, the modulated RF input signal and the feedback signal from PA output are down-converted, respectively, by analog devices, such as mixers, after which the analog intermediate frequency (IF) signals are digitized by analog-to-digital converters for digital predistortion correction processing, followed by pre-distortion processing performed by, for example, a DSP or FPGA chip to generate a digital correction control signal, which is then converted to an analog signal by a digital-to-analog converter, followed by combining the analog correction signal with the RF modulated input signal to yield the input to the power amplifier.

U.S. Pat. No. 7,847,631, entitled, "Method and Apparatus for Performing Predistortion" discloses embodiments described herein to provide better predistortion solutions for the linearization of high power amplifiers, especially those with memory effects. Also described are predistorter apparatus embodiments in which a predistorter includes complex multipliers for multiplying the value of each $P_{kq}$ having the same value of k to produce K products and at least one adder for adding the K products to generate predistorted signal $z_n$ from input signal $x_n$ in accordance with the equation above. The entire contents of which are incorporated herein by reference.

BRIEF SUMMARY OF THE INVENTION

The present invention provides a digital controller for use with an ultrasound power amplifier circuit to increase linearity and efficiency of the ultrasound power amplifier circuit. The digital controller includes a digital signal generator, and a memory unit that is coupled to the digital signal generator. The memory unit includes a processor that obtains an output signal from the ultrasound power amplifier circuit, calculates error by obtaining a difference between an ideal output signal and the output signal that is obtained from the ultrasound power amplifier circuit, and equalizes an input signal from the digital signal generator to reduce nonlinearity in the output signal of the ultrasound power amplifier circuit. The memory unit includes a look-up-table for storing values of error.

The present invention provides a digital controller further including a digital to analog converter that has an output that is coupled to an input of the ultrasound power amplifier circuit. The digital signal generator has a first output that is coupled to an input of the digital to analog converter and has a second output that is coupled to a first input of the memory unit and an analog to digital converter that has an input that is coupled to an output of the ultrasound power amplifier circuit and that has an output that is coupled to a second input of the memory unit. The processor obtains a digital form of the output signal from the ultrasound power amplifier circuit from the analog to digital converter. The processor obtains a digital form of the input signal from the digital signal generator and calculates a digital form of the ideal output signal from the digital form of the input signal and the processor updates a value of error based on a difference between the digital form of the ideal output signal and the digital form of the output signal that is obtained from the ultrasound power amplifier circuit.

The processor equalizes an input signal from the digital signal generator to reduce nonlinearity in the output signal of the ultrasound power amplifier circuit by adding an updated value of error to the input signal from the digital signal generator. The processor provides the equalized input signal to the input of the digital to analog converter and the digital to analog converter provides an analog form of the equalized input signal to the input of the ultrasound power amplifier circuit.

The digital controller includes a delay adjustment block wherein an input of the delay adjustment block is coupled between the first output of the digital signal generator and the input of digital to analog converter and an output of the delay adjustment block is coupled between the output of the analog to digital converter and the second input of the memory unit. The delay adjustment block delays a digital form of the input signal to match a phase of a digital form of a feedback signal from the output of the analog to digital converter. The processor operates in a calibration stage that searches for an optimal value of error using a least-mean-square method and stores in the LUT an optimal value of error that is obtained. The processor operates in an evaluation stage that searches the LUT for a value of error using a phase of the digital input signal as a word address and adds to the digital input signal the value of error that is obtained.

The present invention provides a method for increasing linearity and efficiency of an ultrasound power amplifier circuit by providing a digital signal generator, coupling to the digital signal generator a memory unit that comprises a processor, obtaining in the processor an output signal from the ultrasound power amplifier circuit, calculating in the processor a value of error that is based on a difference between an ideal output signal and the output signal that is obtained from the ultrasound power amplifier circuit, equalizing an input signal from the digital signal generator to reduce nonlinearity in the output signal of the ultrasound power amplifier circuit and providing in the memory unit a LUT for storing values of error.

The present invention provides a method that further includes providing a digital to analog converter, coupling an output of the digital to analog converter to an input of the ultrasound power amplifier circuit, coupling a first output of the digital signal generator to an input of the digital to analog converter and coupling a second output of the digital signal generator to a first input of the memory unit, providing an analog to digital converter, and coupling an input of the analog to digital converter to an output of the ultrasound power amplifier circuit and coupling an output of the analog to digital converter to a second input of the memory unit.

The present invention provides a method further including the steps of: receiving in the processor from the analog to digital converter a digital form of the output signal from the ultrasound power amplifier circuit; receiving in the processor from the digital signal generator a digital form of the input signal from the digital signal generator; calculating in the processor a digital form of the ideal output signal from the digital form of the input signal; and updating in the processor a value of error based on a difference between the digital form of the ideal output signal and the digital form of the output signal that is received from the ultrasound power amplifier circuit.

The present invention provides a method that further includes the step of equalizing in the processor an input signal from the digital signal generator to reduce nonlinearity in the output signal of the ultrasound power amplifier circuit by adding an updated value of error to the input signal from the digital signal generator.

The present invention includes a method that provides the steps of providing the equalized input signal from the processor to the input of the digital to analog converter and providing an analog form of the equalized input signal from the digital to analog converter to the input of the ultrasound power amplifier circuit.

The present invention provides a method that includes the steps of coupling an input of a delay adjustment block between the first output of the digital signal generator and the input of digital to analog converter and coupling an output of the delay adjustment block between the output of the analog to digital converter and the second input of the memory unit.

The present invention provides a method that includes the step of delaying in the delay adjustment block a digital form of the input signal to match a phase of a digital form of a feedback signal from the output of the analog to digital converter.

The present invention provides a method that includes the steps of operating the processor in a calibration stage that searches for an optimal value of error using a least-mean-square method and determining the optimal value of error and storing the optimal value of error in the LUT.

The present invention provides a method that includes the steps of operating the processor in an evaluation stage that searches the LUT for a value of error using a phase of the digital input signal as a word address, determining the value of error and adding to the digital input signal the value of error that is determined.

BRIEF DESCRIPTION OF THE SEVERAL VIEWS OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
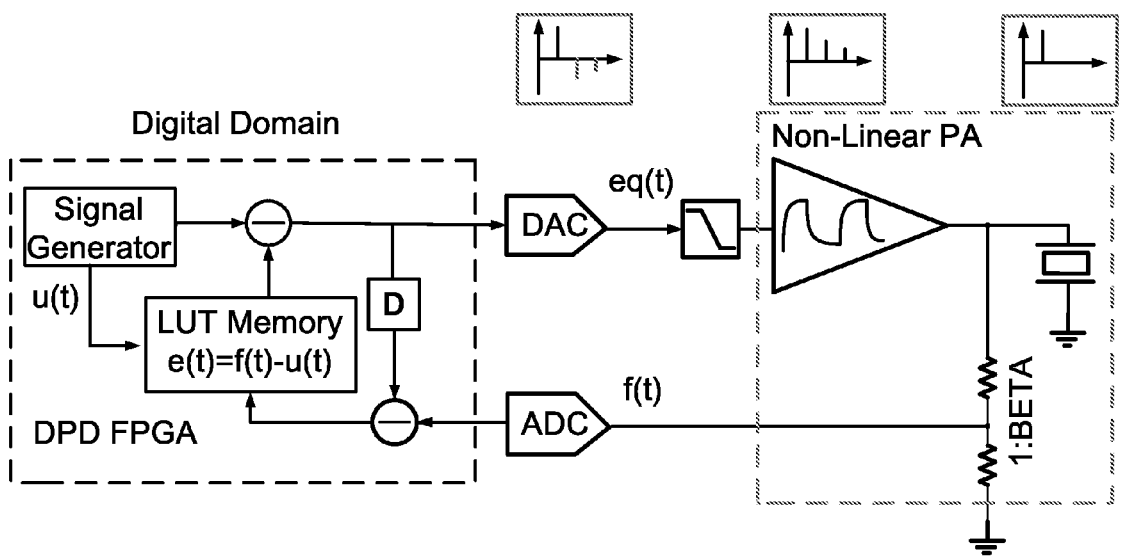
FIG. 1 depicts a block diagram of one embodiment of the digital predistortion system of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

One embodiment of the present invention provides a digital predistortion technique to improve the linearity and power efficiency of a high-voltage class-AB Power Amplifier (PA) for ultrasound transmitter. The present invention provides a system composed of a Digital-to-Analog Converter (DAC), an Analog-to-Digital Converter (ADC), and a Field Programmable Gate Array (FPGA) where the Digital Predistortion (DPD) algorithm is implemented. The DPD algorithm updates the error in the LUT memory during each cycle of a sinusoidal signal using the least-mean-square (LMS) algorithm. On the next signal cycle, the error data is used to equalize the signal with the negative harmonic components to cancel the amplifier's nonlinear response. The algorithm also includes a linear interpolation method to accommodate the windowed sinusoidal signals for B-Mode and Doppler Modes. The measurement test bench uses an arbitrary function generator as the DAC to generate the input signal, an oscilloscope as the ADC to store the output waveform, and MATLAB to implement the DPD algorithm. The measurement results show that the proposed system is able to reduce the second-order Harmonic Distortion (HD2) by 20 dB and the third-order Harmonic Distortion (HD3) by 14.5 dB, while at the same time improving the power efficiency by 18%.

Ultrasonic imaging systems are among the most widely used diagnostic imaging systems in biomedical applications. The ultrasound transmitter, which is used to generate high-voltage (HV) signals to excite the transducer, is one of the most critical components in the entire ultrasound system. The majority of the high voltage (HV) transmitters in commercial ultrasound products are unipolar and bipolar digital pulsers. Most of them contain high harmonic components with a Second-order Harmonic Distortion (HD2) between −30 dB to −40 dB and a Third-Order Harmonic Distortion (HD3) above −20 dB [1]. In advanced imaging techniques such as Tissue Harmonic Imaging (THI) [2], a sinusoidal signal is used to excite the transducer, and by detecting the harmonics produced by the tissue under diagnosis, a good imaging contrast is achieved. Thus for THI, it is critical to have a transmitter capable of generating an output signal with minimum harmonic distortions.

A HV linear amplifier such as the class-AB Power Amplifier (PA) is considered as a more attractive alternative compared to digital pulser because of its lower output harmonic distortions when transmitting sinusoidal signals[3]. In addition, the digital pulser typically have only 3-5 voltage levels compared to the infinite number of voltage levels of the PA, making the Class-AB PA an even better choice especially when the waveforms are windowed or arbitrary code-excited to improve the Signal-to-Noise Ratio (SNR).

The better linearity provided by the HV linear PA does come with the potential price of higher power consumption compared to digital pulser. The class-AB PA has a theoretical power efficiency of 78%. However, in order to reduce the cross-over distortion and other higher-order non-linear responses, larger DC biasing currents are usually introduced. This usually results in a large overdrive voltage from the transistors DC biasing, further lowering the power efficiency. In most RF class-AB power amplifiers, a power efficiency of 20%-30% is achieved depending on the delivered output power [4-5]. On the other hand, in many ultrasound applications, the integration of multiple transmitter channels in a single chip is typically used to minimize the system area and cost, however such methods usually impose a power efficiency requirement on the transmitter due to the maximum power dissipation limitation on the chip package.

One technique to reduce the harmonic distortions of the PA without consuming extra power is using fully-differential topology, which cancels the even-order harmonics in its differential output [6]. However, because the Analog Front End (AFE) of the ultrasound receiver is connected as single-ended configuration to the transducer, this approach requires an off-chip transformer at the output of the transmitter to merge the differential signals. Such transformer is typically bulky, resulting in higher packing size and cost.

Another technique to improve the PA's linearity is pre-distorting the input signal to cancel out the nonlinearity of the PA. This approach senses the output signal, calculates the distortion errors as the difference between the ideal output and the actual output, and equalizes the input waveforms with the negative harmonics to cancel the PA's nonlinearity. This technique has been widely used in RF transmitters with demonstrated effective improvement on the PA's linearity [7-10]; however, the same idea has not yet been applied in ultrasound transmitter designs to improve the transmitting signal linearity.

One embodiment of the present invention provides a LUT-based Digital Predistortion DPD system for ultrasonic transmitters. The DPD scheme is implemented in the digital domain, and the algorithm is divided into two stages: calibration and evaluation. During the calibration stage the system searches for the optimal error based on the output signal using a least-mean-square (LMS) method, and stores the error in the LUT memory. In the evaluation stage, the phase of the input signal is used as the word address to access the error in the LUT. The error is added into the input to generate the equalized signal containing the negative harmonic components. Then the equalized input are converted into analog signal through the DAC and sent into the Class-AB PA to cancel the PA's nonlinear characteristics. The proposed algorithm works for both constant-amplitude sine-wave signal and amplitude-windowed signals such as Morlet wavelet.

FIG. 1 depicts a block diagram of one embodiment of the DPD system of the present invention. The system is composed of a DAC, an ADC, and an FPGA where the digital components for the DPD algorithm, delay adjustment block, and the LUT memory are implemented. At $t=t_0$, the FPGA and DAC sends out an ideal input sinusoidal signal u(t). The output of the PA can then be expressed as Tyler expansion in terms of u(t):

$$o(t)=A_1 \cdot u(t)+A_2 \cdot u(t)^2+A_3 \cdot u(t)^3+ \quad (1)$$

where $A_1$, $A_2$ and $A_3$ are the first, second and third-order gain of the non-linear amplifier. With a unity-amplitude sinusoidal signal as the input signal, $u(t)=\cos(\omega t)$ and assuming $A_1 \gg 3A_3/4$, equation (1) becomes:

$$\begin{aligned}o(t) &= A_1 \cdot \cos(\omega t) + A_2 \cdot \cos^2(\omega t) + A_3 \cdot \cos^3(\omega t) + \ldots \\ &= A_1 \cdot \cos(\omega t) + \frac{A_2}{2} \cdot [1+\cos(2\omega t)] + \frac{A_3}{4} \cdot [3\cos(\omega t) + \cos(3\omega t)] + \ldots \\ &\approx A_1 \cdot \cos(\omega t) + \frac{A_2}{2} \cdot \cos(2\omega t) + \frac{A_3}{4} \cdot \cos(3\omega t) + \ldots \end{aligned} \quad (2)$$

Before feeding back into the FPGA, the output voltage is attenuated by a factor of $A_1$ through a resistive divider. The error could be simply calculated as the difference between the attenuated feedback signal f(t) and the input test signal u(t):

$$e(t) = f(t) - u(t) \quad (3)$$

$$= \frac{o(t)}{A_1} - u(t)$$

$$= \left(\cos(\omega t) + \frac{A_2}{2A_1} \cdot \cos(2\omega t) + \frac{A_3}{4A_1} \cdot \cos(3\omega t) + \ldots\right) - \cos(\omega t)$$

$$\approx \frac{A_2}{2A_1} \cdot \cos(2\omega t) + \frac{A_3}{4A_1} \cdot \cos(3\omega t) + \ldots$$

On the next cycle of the input sinusoidal signal, the pre-distorted input signal eq(t) with negative harmonic components is given by:

$$eq(t) = u(t) - e(t) \quad (4)$$

$$= \cos(\omega t) - \frac{A_2}{2A_1} \cdot \cos(2\omega t) - \frac{A_3}{4A_1} \cdot \cos(3\omega t) - \ldots$$

And the equalized amplifier output becomes:

$$o_{eq}(t) = A_1 \cdot eq(\omega t) + A_2 \cdot eq(2\omega t) + A_3 \cdot eq(3\omega t) + \ldots \quad (5)$$

$$\approx \left[A_1 \cdot \cos(\omega t) - \frac{A_2}{2} \cdot \cos(2\omega t) - \frac{A_3}{4} \cdot \cos(3\omega t)\right] +$$

$$A_2 \cdot \cos^2(\omega t) + A_3 \cdot \cos^3(\omega t) + \ldots$$

$$= A_1 \cdot u(\omega t) + RES$$

where RES is the remaining harmonic components above 4th-order. Equations (4) and (5) show that the DPD algorithm calculates the errors and the equalized input signals which are used to cancel the inherent harmonic distortions in the PA on the next signal cycle.

Figure 2:
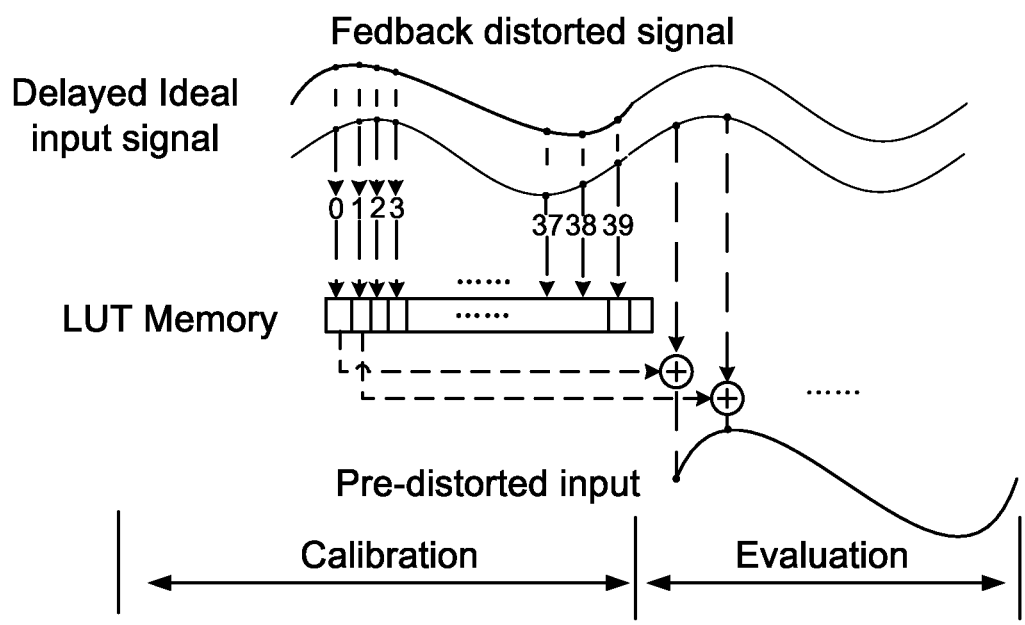
FIG. 2 is an image of the calibration and evaluation algorithm illustrating the Look-Up Table digital predistortion system technique with calibration and evaluation stages.

FIG. 2 is an image of the calibration and evaluation algorithm illustrating the LUT DPD technique with calibration and evaluation stages. The DPD algorithm consists of calibration and evaluation stages that work alternatively with each other as shown in FIG. 2 to obtain the optimal coefficients to be stored LUT memory.

The calibration stage updates and stores the errors in the LUT memory. First, the input signal is delayed to match the phase of the digital feedback signal f(t) inside the FPGA. The harmonic error is then generated by removing the energy at the signal fundamental frequency of f(t). At the end of each training cycle, the LUT is updated by adding the newly created digitalized signal error e(t) on the existing data in the LUT until the LMS error is found. During the evaluation stage, the system starts with searching the LUT using the phase of the input waveform as the word address. After locating the e(t), the pre-equalized input signal is created by adding e(t) into the input signal.

To determine the optimum errors of the LUT, the Mean-Square Error (MSE) of each test cycle is calculated and compared with the MSE of the previous cycle using LMS algorithm. The LUT Memory update stops when the following condition is achieved:

$$MSE(i) < MSE(i+2) \quad (6)$$

or $$|MSE(i)| < 1 LSB \quad (7)$$

The algorithm also provides a solution to predistort the amplitude-windowed sine-wave such as Morlet wavelet.

Figure 3:
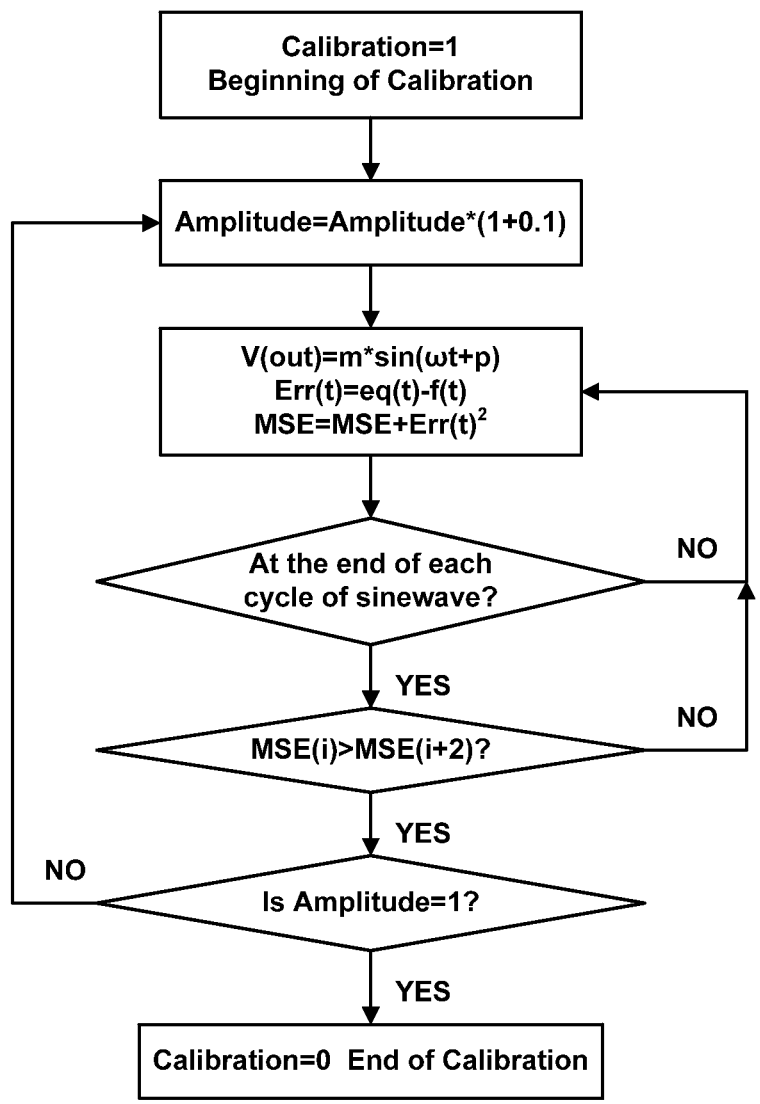
FIG. 3 is a simplified flow chart of the calibration stage.
Figure 4:
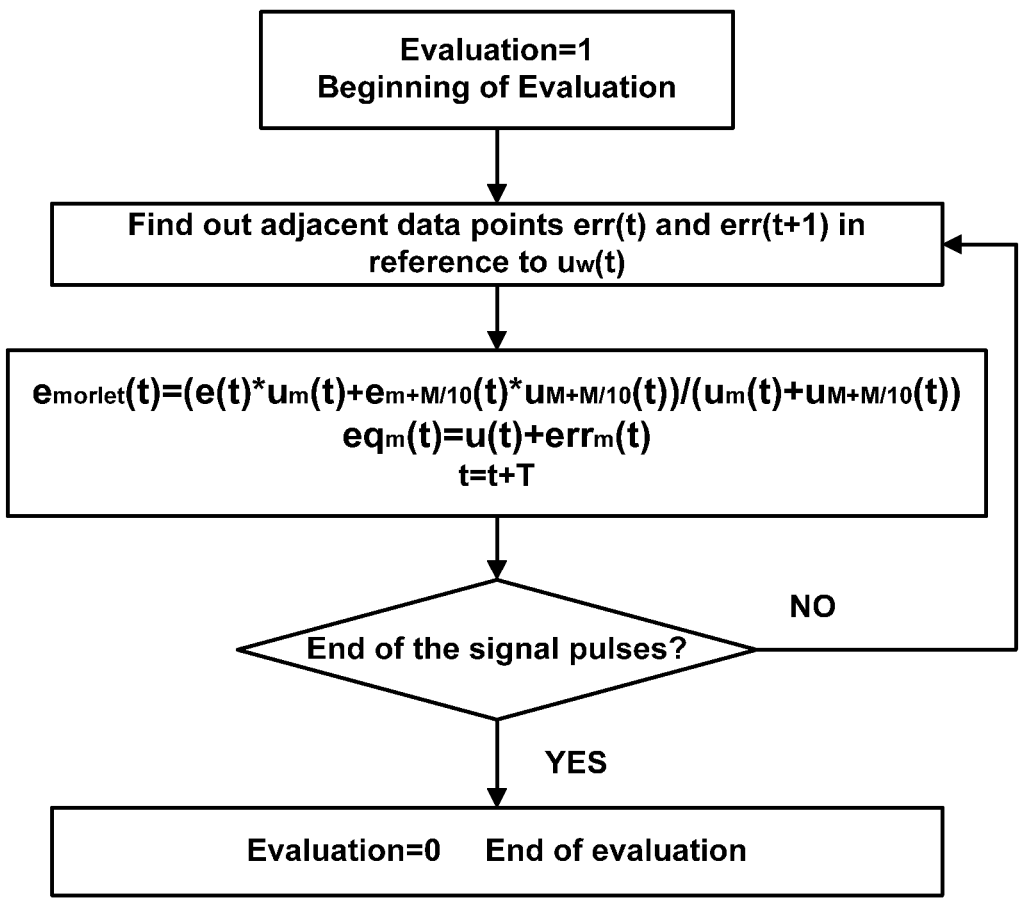
FIG. 4 is a simplified flow chart of the evaluation stage.

FIG. 3 and FIG. 4 are the simplified flow chart of the calibration and evaluation stage respectively. Assuming a Morlet wavelet signal morlet(t) with maximum amplitude of M, during calibration stage, M is divided into 10 sections. For each section, the DPD system continuously sends out a calibration signal $u_m(t) = m \sin(\omega t)$ with $M/10 < m < M$ until the LMS error is found. The corresponding errors are obtained and stored in the LUT. At the end of the calibration stage, the LUT becomes a 2-Dimensional Memory with both the amplitude m and the phase θ as the word address.

During the evaluation stage, the errors for the Morlet wavelet $e_{morlet}(t)$ are searched and calculated. First we determine the phase of the Morlet wavelet $\theta_0$ at each single data point, then the magnitude of the calibration sinusoidal signal $|u_m(t_{\theta 0})|$ at phase $\theta_0$ are compared to the magnitude of the Morlet wavelet until the relationship of $|u_m(t_{00})| < |m(t_{00})| < |u_{m+M/10}(t_{00})|$ is achieved. Then the corresponding error data in the LUT $e_m(t_{\theta 0})$ and $e_{m+M/10}(t_{\theta 0})$ are used to calculate the error data $e_{morlet}(t_{\theta 0})$ at time $t = t_{\theta 0}$:

$$e_{morlet}(t_{\theta 0}) = \frac{(err_m(t_{\theta 0}) \cdot u_m(t_{\theta 0}) + err_{m+M/10}(t_{\theta 0}) \cdot u_{m+M/10}(t_{\theta 0}))}{u_m(t_{\theta 0}) + u_{m+M/10}(t_{\theta 0})} \quad (8)$$

Although the DPD algorithm reduces the PA's harmonic distortions, the thermal and environmental noises of the PA can significantly affect the accuracy of the algorithm if they are not properly eliminated. Based on equation (3), if the attenuated feedback signal f(t) contains noise energies, it will remain in the error signal e(t) and get passed along into the equalized signal eq(t). Then equation (3) becomes:

$$e(t) = f(t) - u(t) \quad (9)$$

$$\approx \frac{A_2}{2A_1} \cdot \cos(2\omega t) + \frac{A_3}{4A_1} \cdot \cos(3\omega t) + \frac{V_{noise}}{A_1} + \ldots$$

And the pre-distorted input signal becomes:

$$eq_1(t) = u(t) - e(t) \quad (10)$$

$$= \cos(\omega t) - \frac{A_2}{2A_1} \cdot \cos(2\omega t) - \frac{A_3}{4A_1} \cdot \cos(3\omega t) - \frac{V_{noise}}{A_1} - \ldots$$

If the harmonic energy is at the same or lower level than the output signal noise floor, the harmonics are buried below the noise floor which limits the effectiveness of the DPD algorithm. In this case, a moving average scheme is applied to the output signal to suppress the noise by adding and averaging the adjacent digital sampling points of ADC (not shown on figure) the output over several measurements for each LUT entry [11]. The effectiveness of the DPD also depends on the accuracy of the DAC and ADC.

Although the calculation on the previous section shows a complete cancellation of HD2 and HD3 after the first iteration, the system usually takes more training cycles to achieve the LMS error due to the amplifier thermal and equipment environmental noise. Simulation results show that the DPD system takes 10 iterations to achieve the minimum MSE. The fourth design considerations in the DPD system is the memory calibration time. Based on the above simulations, the system takes 10 iterations to achieve the LMS error. In addition, the moving average scheme requires 4-10 signal cycles in each iteration depending on the PA's output noise. Hence, during the calibration if we send a signal of 5 MHz sine-wave with 1% duty cycle, the overall training time for each single channel is given by the following equation:

$$T_{total} = \frac{T_{Signal} \cdot \text{Iterations} \cdot \text{Moving\_average\_cycles}}{\text{Duty\_cycle}} \quad (11)$$

$$= \frac{200nS \cdot 10 \cdot 10}{1\%}$$

$$= 1 \text{ ms}$$

In other words, for a single-channel transmitter it takes 1 ms to finish the memory calibration procedure.

The last yet important issue is the memory size and its access time. Different from the RF applications, the transmitting signals in the ultrasonic applications have a repeated pattern between each pulse repetition period, which only requires the LUT to store one period of error data as long as the user does not change the transmitting signal configuration. This reduces the LUT size requirement compared to the RF applications which typically requires a 2-D LUT memory with I and Q as word addresses [8]. In addition, techniques such as Multi-Level LUT and complex-gain based DPD algorithm could also be applied to further reduce the memory size [13]. Table 1 is a table of the performance comparison between the PA output signals with and without DPD*.

TABLE 1

|  | Before Predistortion | After Predistortion | Improvement |
|---|---|---|---|
| HD2 (dB) | −35.82 | −61.28 | 25.46 |
| HD3 (dB) | −40.78 | −56.17 | 15.39 |
| Power Efficiency | 26% | 44% | 18% |

Figure 5:
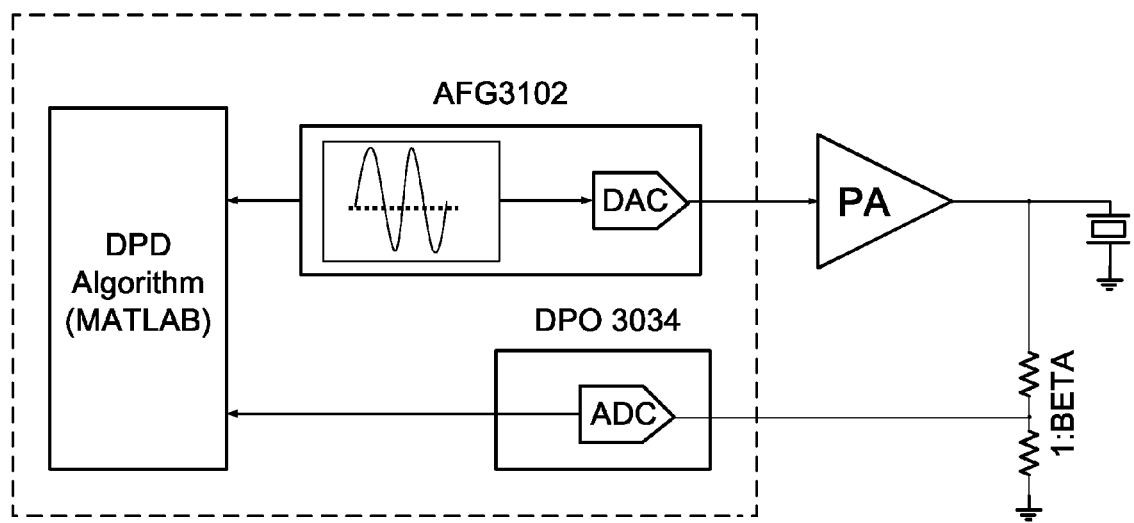
FIG. 5 is a schematic of one embodiment of the digital predistortion system of the present invention using a Tektronix AFG3102 arbitrary function generator as the input DAC, a Tektronix DP03034 oscilloscopeas the ADC, and a MATLAB program to implement the DPD algorithm.

FIG. 5 is a schematic of one embodiment of the DPD system of the present invention using a Tektronix AFG3102 arbitrary function generator as the input DAC, a Tektronix DP03034 oscilloscopeas the ADC, and a MATLAB program to implement the DPD algorithm. And in an integrated fully-differential cascaded push-pull class-AB PA as the HV ultrasound transmitter, which is fabricated in a 0.7 um SOI process. The PA has a closed-loop bandwidth of 6 MHz and is capable of driving the load of 300 pF in parallel with 100Ω with a signal swing up to 180 $V_{pp}$ in the fully-differential mode. The experiment is carried out using one of the single-ended channels with half of the maximum voltage swing.

Not only does the DPD system have improvement on the PA linearity, it also helps the PA to improve its power efficiency. Without DPD, the linearity of the HV class-AB PA is achieved by using large DC biasing current and high power supply voltage to keep the signal from clipping. By applying the DPD system, both the DC biasing current of the PA and the extra supply voltage headroom can be reduced, while the linearity is maintained by the DPD system. Table 1 compares the results between using and without using the DPD technique. With DPD, a low HD2 of −55 dB is achieved and the power efficiency is improved by 18% compared to not using the DPD. The output voltage swing is maintained the same between the two cases.

The DPD system has another benefit of improving on the system bandwidth. For conventional HV PAs, the analog negative feedback needs to incorporate the high-voltage class-AB output stage to compensate for the nonlinear characteristics of HV transistors. This adds one additional non-dominant pole in the feedback loop, requiring extra compensation in the PA to maintain the loop stability. With the help of the DPD architecture, the HV class-AB output stage can be put outside the loop while the class-AB output stage's non-linearities and offsets are reduced through the DPD technique. This eliminates the output-stage pole in the feedback loop and improves the −3 dB closed-loop bandwidth of the PA.

The DPD system of the presented invention provides improved linearity, power efficiency, and bandwidth of a HV PA for ultrasonic transmitter. A complete algorithm including calibration and evaluation is presented, and a measurement setup consisting of a function generator, an oscilloscope, and a PA EVM is implemented to demonstrate the effective of the proposed DPD system.

The measured results show a significant improvement on the linearity and power efficiency. The proposed method works for both the constant-magnitude sine-wave signals, 6-cycle burst signal and windowed waveform, and requires minimum additional hardware on the overall ultrasonic transmitting system.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof"

is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

[1] S. Huang, P. Li, "Arbitrary Waveform Coded Excitation Using Bipolar Square Wave Pulsers in Medical Ultrasound," *IEEE Trans. Ultrasonics, Ferroelectrics and Frequency Control*. vol. 53, pp. 106-116.

[2] J U Harrier, L Mayfrank, M Mull, C Klotzsch "Second harmonic imaging: a new ultrasound technique to access human brain tumor perfusion" *J. Neurol Neurosurg Psychiatry* 74: pp. 333-338, 2003.

[3] B. Haider, "Power Drive Circuits for Diagnostic Medical Ultrasound." *IEEE International Symposium on Power Semiconductor Devices and IC's*. 2006, pp. 1-8.

[4] C. Wang, L. E. Larson, P. M. Asbeck, "A Nonlinear Capacitance Cancellation Technique and its application to a CMOS Class AB Power Amplifier." *IEEE Radio Frequency Integrated Circuit Symposium.* 2001, pp. 29-42.

[5] M. Avasarala, D. S. Day, S. Chan, P. Gregory, J. R. Basset, "High Efficiency Small Size 6W Class AB X-Band Power Amplifier Module using a Novel MBE GaAs FET." *IEEE MTT-S International Microwave Symposium Digest.* 1988, pp. 843-846.

[6] Hitachi High-Voltage Linear Amplifier Brochure, *Hitachi Micro Device Division, Tokyo, Japan*, 2011.

[7] Y. Y. Woo, J. Kim, J. Yi, S. Hong, I. Kim, J. Moon, B. Kim, "Adaptive Digital Feedback Pre-distortion Technique for linearizing Power Amplifiers" *IEEE Trans. On Microwave Theory and Techniques*. vol. 55, pp. 932-940.

[8] U. Cerasani, Y. Le Moullec, T. Tian, "A Practical FPGA-Based LUT-Predistortion Technology For Switch-Mode Power Amplifier Linearization." *NORCHIP,* 2009 pp, 1-5.

[9] Y. Nagata, "Linear Amplification Technique for Digital Mobile Communications." *IEEE Vehicular Technology Conference.* 1989, pp. 159-164.

[10] J. K. Cavers, "Amplifier Linearization using a Digital Predistorter with Fast Adaptation and Low Memory Requirements." *IEEE Trans. Vehicular Technology*. Vol. 39, pp. 374-382.

[11] S. Chung, J. W. Holloway, J. L. Dawson, "Open-Loop Digital Predistortion Using Cartesian Feedback for Adaptive RF Power Amplifier Linearization." *IEEE/MTT-S International Microwave Symposium,* 2007 pp. 1449-1452.

[12] E. Brunner, "How Ultrasound System Considerations Influence Front-End Component Choice." *Analog Dialogue, Analog Devices.* 2002.

[13] D. Kwon, H. Li, Y. Chang, R. Tseng, Y. Chiu "Digitally Equalized CMOS Transmitter Front-End With Integrated Power Amplifier." *IEEE Journal of Solid-State Circuits.* vol. 45, pp. 1602-1614.

What is claimed is:

1. A digital controller for use with an ultrasound power amplifier circuit to increase linearity and efficiency of the ultrasound power amplifier circuit, wherein the digital controller comprises:

a digital signal generator that has a first output and a second output;

a digital to analog converter that has an output coupled to an input of the ultrasound power amplifier circuit and an input coupled to the first output of the digital signal generator;

a memory unit that has a first input coupled to the second output of the digital signal generator, an output coupled to the input of the digital to analog converter, and the memory unit comprises a processor and a look-up table;

a delay adjustment block coupled to the input of the digital to analog converter;

a feedback circuit that has a first input comprising an analog to digital converter coupled to an output of the ultrasound power amplifier circuit, a second input coupled to the delay adjustment block, and an output coupled to a second input of the memory unit; and the processor obtains an output signal from the ultrasound power amplifier circuit through the feedback circuit and an ideal output signal from the digital signal generator that is delayed based on the delay adjustment block, and repeatedly operates in a calibration mode followed by an evaluation mode, wherein the processor: (i) calculates a value of error based on a difference between the delayed ideal output signal and the output signal obtained from the ultrasound power amplifier circuit, and stores the value of error in the look-up table in the calibration mode, and (ii) equalizes an input signal from the digital signal generator to reduce nonlinearity in the output signal of the ultrasound power amplifier circuit using the value of error stored in the look-up table in the evaluation mode.

2. The digital controller as claimed in claim 1, wherein:

the processor obtains a digital form of the output signal from the ultrasound power amplifier circuit from the analog to digital converter;

the processor obtains a digital form of the input signal from the digital signal generator, calculates a digital form of the ideal output signal from the digital form of the input signal and delays the digital form of the ideal output signal based on the delay adjustment block; and wherein the value of error is based on the difference between the digital form of the delayed ideal output signal and the digital form of the output signal obtained from the ultrasound power amplifier circuit.

3. The digital controller as claimed in claim 2, wherein:

the processor provides the equalized input signal to the input of the digital to analog converter; and the digital to analog converter provides an analog form of the equalized input signal to the input of the ultrasound power amplifier circuit.

4. The digital converter as claimed in claim 1, wherein the delay adjustment block delays a digital form of the input signal to match a phase of a digital form of the output signal obtained from the ultrasound power amplifier circuit through the feedback circuit.

5. The digital controller as claimed in claim 4, wherein the value of error comprises an optimal value of error and the processor operates searches for the optimal value of error using a least-mean-square method.

6. The digital controller as claimed in claim 4, wherein the processor searches the look-up-table for the value of error using only a phase of the digital input signal as a word address.

7. The digital controller as claimed in claim 1, wherein the look-up table comprises a one-dimensional look-up table.

8. The digital controller as claimed in claim 1, wherein only one period of value of errors is stored in the look-up table as long as a transmitting signal configuration is not changed.

9. The digital controller as recited in claim 1, wherein the feedback circuit further comprises a resistive divider circuit coupled between the output of the ultrasound power amplifier circuit and the analog to digital converter.

10. A method for increasing linearity and efficiency of an ultrasound power amplifier circuit, wherein the method comprises the steps of:
   providing a digital signal generator having a first output and a second output;
   providing a digital to analog converter that has an output coupled to an input of the ultrasound power amplifier circuit and an input is coupled to the first output of the digital signal generator;
   providing a memory unit having a first input coupled to the second output of the digital signal generator, an output coupled to the input of the digital to analog converter, and the memory unit comprises a processor and a look-up-table;
   providing a delay adjustment block coupled to the input of the analog converter;
   providing a feedback circuit having a first input comprising an analog to digital converter coupled to an output of the ultrasound power amplifier circuit, a second input coupled to the delay adjustment block, and an output coupled to the second input of the memory unit;
   obtaining in the processor an output signal from the ultrasound power amplifier circuit through the feedback circuit and an ideal output signal from the digital signal generator that is delayed based on the delay adjustment block; and
   repeatedly operating the processor in a calibration mode followed by an evaluation mode, wherein the processor: (i) calculates a value of error based on a difference between the delayed ideal output signal and the output signal obtained from the ultrasound power amplifier circuit, and stores the value of error in the look-up table in the calibration mode, and (ii) equalizes an input signal from the digital signal generator to reduce nonlinearity in the output signal of the ultrasound power amplifier circuit using the value of error stored in the look-up table in the evaluation mode.

11. The method as claimed in claim 10, further comprising the steps of:
   receiving in the processor from the analog to digital converter a digital form of the output signal from the ultrasound power amplifier circuit;
   receiving in the processor from the digital signal generator a digital form of the input signal from the digital signal generator;
   calculating in the processor a digital form of the ideal output signal from the digital form of the input signal;
   delaying the digital form of the ideal output signal based on the delay adjustment block; and
   wherein the value of error is based on the difference between the digital form of the delayed ideal output signal and the digital form of the output signal received from the ultrasound power amplifier circuit.

12. The method as claimed in claim 11, further comprising the steps of:
   providing the equalized input signal from the processor to the input of the digital to analog converter; and
   providing an analog form of the equalized input signal from the digital to analog converter to the input of the ultrasound power amplifier circuit.

13. The method as claimed in claim 10, further comprising the step of:
   delaying a digital form of the input signal to match a phase of a digital form of the output signal obtained from the ultrasound power amplifier circuit through the feedback circuit using the delay adjustment block.

14. The method as claimed in claim 13, wherein:
   the value of error comprises an optimal value of error and the processor searches for the optimal value of error using a least-mean-square method.

15. The method as claimed in claim 13, wherein:
   the processor searches the look-up-table for the value of error using only a phase of the digital input signal as a word address.

16. The method as claimed in claim 10, wherein the look-up table comprises a one-dimensional look-up table.

17. The method as claimed in claim 10, wherein only one period of value of errors is stored in the look-up table as long as a transmitting signal configuration is not changed.

18. The method as recited in claim 10, wherein the feedback circuit further comprises a resistive divider circuit coupled between the output of the ultrasound power amplifier circuit and the analog to digital converter.

19. A digital controller for use with an ultrasound power amplifier circuit to increase linearity and efficiency of the ultrasound power amplifier circuit, wherein the digital controller comprises:
   a digital signal generator coupled to the ultrasound power amplifier circuit;
   a memory unit that is coupled to the digital signal generator and comprises a processor and a look-up table;
   a feedback circuit that couples the ultrasound power amplifier circuit to the memory unit;
   the processor obtains an output signal from the ultrasound power amplifier circuit through the feedback circuit, and an ideal output signal from the digital signal generator that is delayed to match a phase of the output signal and repeatedly operates in a calibration mode followed by an evaluation mode, wherein the processor: (i) calculates a value of error based on a difference between the delayed ideal output signal and the output signal obtained from the ultrasound power amplifier circuit, and stores the value of error in the look-up table in the calibration mode, and (ii) equalizes an input signal from the digital signal generator to reduce nonlinearity in the output signal of the ultrasound power amplifier circuit using the value of error stored in the look-up table in the evaluation mode, wherein the value of error is found in the look-up-table using only a phase of the input signal as a word address; and
   wherein only one period of value of errors is stored in the look-up table as long as a transmitting signal configuration is not changed.

20. The digital controller as claimed in claim 19, wherein:
the processor obtains a digital form of the output signal from the ultrasound power amplifier circuit using an analog to digital converter;
the processor obtains a digital form of the input signal from the digital signal generator, calculates a digital form of the ideal output signal from the digital form of the input signal and delays the digital form of the ideal output signal based on a delay adjustment block; and
wherein the value of error is based on the difference between the digital form of the delayed ideal output signal and the digital form of the output signal obtained from the ultrasound power amplifier circuit.

21. The digital controller as claimed in claim 20, wherein the processor provides the equalized input signal to a digital to analog converter, which provides an analog form of the equalized input signal to the ultrasound power amplifier circuit.

22. The digital controller as claimed in claim 21, wherein the delay adjustment block is coupled between the digital to analog converter and the feedback circuit.

23. The digital controller as claimed in claim 22, wherein the value of error comprises an optimal value of error and the processor operates searches for the optimal value of error using a least-mean-square method.

24. The digital controller as claimed in claim 19, wherein the look-up table comprises a one-dimensional look-up table.

25. The digital controller as recited in claim 19, wherein the feedback circuit further comprises a resistive divider circuit coupled between the output of the ultrasound power amplifier circuit and the analog to digital converter.

26. A method for increasing linearity and efficiency of an ultrasound power amplifier circuit, wherein the method comprises the steps of:
providing a digital signal generator;
providing a memory unit coupled to the digital signal generator, the memory unit comprising a processor and a look-up-table;
obtaining in the processor an output signal from the ultrasound power amplifier circuit through a feedback circuit that couples the ultrasound power amplifier circuit to the memory unit;
obtaining in the processor an ideal output signal from the digital signal generator that is delayed to match a phase of the output signal;
repeatedly operating the processor in a calibration mode followed by an evaluation mode, wherein the processor: (i) calculates a value of error based on a difference between the delayed ideal output signal and the output signal obtained from the ultrasound power amplifier circuit, and stores the value of error in the look-up table in the calibration mode, and (ii) equalizes an input signal from the digital signal generator to reduce nonlinearity in the output signal of the ultrasound power amplifier circuit using the value of error stored in the look-up table in the evaluation mode, wherein the value of error is found in the look-up-table using only a phase of the input signal as a word address; and
wherein only one period of value of errors is stored in the look-up table as long as a transmitting signal configuration is not changed.

27. The method as claimed in claim 26, further comprising the steps of:
receiving in the processor from an analog to digital converter a digital form of the output signal from the ultrasound power amplifier circuit;
receiving in the processor from the digital signal generator a digital form of the input signal from the digital signal generator;
calculating in the processor a digital form of the ideal output signal from the digital form of the input signal and delaying the digital form of the ideal output signal based on a delay adjustment block; and
wherein the value of error is based on the difference between the digital form of the delayed ideal output signal and the digital form of the output signal received from the ultrasound power amplifier circuit.

28. The method as claimed in claim 27, further comprising the steps of:
providing the equalized input signal from the processor to the digital to analog converter; and
providing an analog form of the equalized input signal from the digital to analog converter to the ultrasound power amplifier circuit.

29. The method as claimed in claim 28, further comprising the steps of:
coupling an input of the delay adjustment block between the digital to analog converter and the feedback circuit.

30. The method as claimed in claim 29, wherein the value of error comprises an optimal value of error and the processor searches for the optimal value of error using a least-mean-square method.

31. The method as claimed in claim 26, wherein the look-up table comprises a one-dimensional look-up table.

32. The method as recited in claim 26, wherein the feedback circuit further comprises a resistive divider circuit coupled between the output of the ultrasound power amplifier circuit and the analog to digital converter.

* * * * *